United States Patent
Kim

(10) Patent No.: US 9,337,777 B2
(45) Date of Patent: May 10, 2016

(54) AMPLIFIER

(71) Applicant: Murata Manufacturing Co., Ltd., Kyoto (JP)

(72) Inventor: Ryangsu Kim, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/569,928

(22) Filed: Dec. 15, 2014

(65) Prior Publication Data

US 2015/0194935 A1 Jul. 9, 2015

(30) Foreign Application Priority Data

Jan. 6, 2014 (JP) .................................. 2014-000338

(51) Int. Cl.
| | |
|---|---|
| *H03F 1/22* | (2006.01) |
| *H03F 1/02* | (2006.01) |
| *H03F 3/193* | (2006.01) |
| *H03F 1/32* | (2006.01) |
| *H03F 3/21* | (2006.01) |

(52) U.S. Cl.
CPC ............ *H03F 1/0211* (2013.01); *H03F 1/0261* (2013.01); *H03F 1/223* (2013.01); *H03F 1/3205* (2013.01); *H03F 3/193* (2013.01); *H03F 3/211* (2013.01); *H03F 2200/516* (2013.01); *H03F 2201/3215* (2013.01)

(58) Field of Classification Search
CPC .................................. H03F 1/22; H03F 1/0288
USPC ..................................... 330/311, 295, 124 R
See application file for complete search history.

(56) References Cited

U.S. PATENT DOCUMENTS

| | | | | |
|---|---|---|---|---|
| 6,064,264 | A  * | 5/2000 | Tarsia et al. .................... | 330/277 |
| 6,788,148 | B2 * | 9/2004 | Orr et al. ........................ | 330/286 |
| 6,807,118 | B2 | 10/2004 | Perner | |
| 7,853,235 | B2 | 12/2010 | Aparin | |
| 8,604,880 | B2 * | 12/2013 | Boor .............................. | 330/277 |
| 8,890,615 | B2 * | 11/2014 | Boor .............................. | 330/277 |

(Continued)

FOREIGN PATENT DOCUMENTS

| | | | |
|---|---|---|---|
| JP | 2004-200867 A | 7/2004 | |
| JP | 2004-229303 A | 8/2004 | |

(Continued)

OTHER PUBLICATIONS

Tae Wook Kim, Bonkee Kim, and Kwyro Lee, Highly Linear Receiver Front-End Adopting MOSFET Transconductance Linearization by Multiple Gated Transistors, IEEE Journal of Solid-State Circuits, pp. 223-229; vol. 39, No. 1, Jan. 2004.
Office action issued in JP2014-000338 dated Dec. 1, 2015.

*Primary Examiner* — Henry Choe
(74) *Attorney, Agent, or Firm* — Pearne & Gordon LLP

(57) ABSTRACT

An amplifier includes a first FET having a first back-gate end, a second FET having a second back-gate end, a third FET having a third back-gate end, a first power supply terminal configured to apply a voltage to the first back-gate end, a second power supply terminal configured to apply a voltage to the second back-gate end, and a third power supply terminal configured to apply a voltage to the third back-gate end. In the stated amplifier, the first through third power supply terminals are configured such that different voltages can be set to the first through third power supply terminals.

7 Claims, 9 Drawing Sheets

(56) References Cited

U.S. PATENT DOCUMENTS

2004/0145957 A1 7/2004 Perner
2007/0075784 A1* 4/2007 Pettersson et al. ............ 330/311

FOREIGN PATENT DOCUMENTS

| JP | 06-180492 A | 7/2006 |
| JP | 13-081202 A | 5/2013 |

* cited by examiner

AMPLIFIER

BACKGROUND OF THE INVENTION

1. Field of the Invention

The present invention relates to amplifiers, in particular, relates to the linearization techniques of high frequency amplifiers.

2. Description of the Related Art

High frequency amplifiers are used in wireless communication systems, for example. High frequency amplifiers amplify high frequency signals, for example, modulation signals such as receiving signals, transmission signals, or the like.

A linear characteristic is one of the characteristics of a high frequency amplifier. As indices for indicating a linear characteristic of an amplifier configured to amplify modulation signals, a third order intermodulation distortion (IMD3) characteristic and a third order input intercept point (IIP3) are well-known, for example.

Japanese Unexamined Patent Application Publication No. 2006-180492 discloses an amplifier in which multiple gated transistors (MGTRs) are used. This amplifier is configured such that the characteristics of the main field effect transistors (FETs) differ from the characteristics of the auxiliary FETs in order to improve the linearity and reduce the third order intermodulation distortion thereof.

In order to configure the amplifier such that the characteristics of the main FETs differ from the characteristics of the auxiliary FETs, Japanese Unexamined Patent Application Publication No. 2006-180492 proposes to set the gate bias voltages supplied to the FETs (DC voltages applied to the gate ends) in the amplifier to different values, and to change the sizes of the respective FETs.

In the case where the gate bias voltages of the respective FETs are set to different values, DC cut capacitors are provided to the gate ends of the respective FETs so as to isolate the gate ends thereof from one another in a direct current (DC) way. However, if the respective FETs are equipped with the DC cut capacitors, the size of the amplifier (for example, the semiconductor chip size) increases, which makes it difficult to miniaturize the amplifier.

Meanwhile, in the case where the size of each of the FETs is varied, the unless power consumption of the FET is appropriately adjusted, the consumption current increases depending on the size of FET, which makes it difficult to lower the power consumption of the amplifier.

BRIEF SUMMARY OF THE INVENTION

Accordingly, it is an object of the present invention to provide an amplifier in which the reduction in size and power consumption is realized and a third order intermodulation distortion characteristic is improved.

An amplifier according an aspect of the present invention includes a first FET having a first back-gate end, a second FET having a second back-gate end, a third FET having a third back-gate end, a first power supply terminal configured to apply a voltage to the first back-gate end, a second power supply terminal configured to apply a voltage to the second back-gate end, and a third power supply terminal configured to apply a voltage to the third back-gate end. Gate ends of the first through third FETs are connected in common with one another, source ends of the first through third FETs are connected in common with one another, and drain ends of the first through third FETs are connected in common with one another. The first through third power supply terminals are configured such that different voltages are set to the first through third power supply terminals, respectively.

The amplifier in the above-described configuration includes the first through third power supply terminals configured to apply voltages to the first through third back-gate ends. In addition, the first through third power supply terminals are so configured as to be respectively set to different voltages. Accordingly, in the amplifier having the above configuration, different voltages can be supplied to the first through third back-gate ends by supplying different voltages to the first through third power supply terminals, respectively.

The third order intermodulation distortion characteristic of the amplifier can be improved by supplying appropriate voltages to the first through third back-gate ends, respectively.

In the amplifier having the above configuration, the gate ends are connected in common. In other words, DC cut capacitors to isolate the gate ends from one another in a DC way need not be provided.

According to the aspect of the present invention, it is possible to provide an amplifier in which reduction in size and power consumption is realized and a third order intermodulation distortion characteristic is improved.

Other features, elements, characteristics and advantages of the present invention will become more apparent from the following detailed description of preferred embodiments of the present invention with reference to the attached drawings.

BRIEF DESCRIPTION OF THE SEVERAL VIEWS THE DRAWINGS

DETAILED DESCRIPTION OF THE INVENTION

Figure 1:
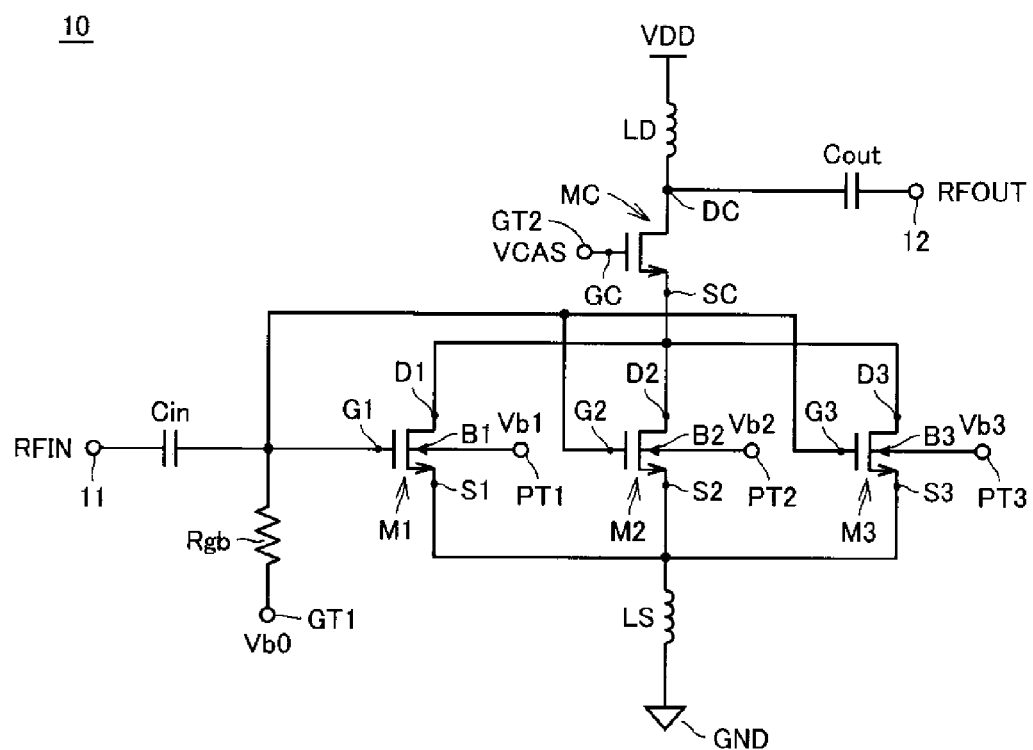
FIG. 1 is a diagram for explaining a general configuration of an amplifier according to a first embodiment of the present invention.

Hereinafter, the preferred embodiments of the present invention will be described in detail with reference to the drawings. Same or equivalent elements in the drawings will be given the same reference signs and the descriptions thereof will not be repeated.

First Embodiment

FIG. 1 is a diagram for explaining a general configuration of an amplifier 10 according to a first embodiment of the present invention.

The amplifier 10 includes a transistor M1 as a first FET, a transistor M2 as a second FET, and a transistor M3 as a third FET. The transistor M1, the transistor M2, and the transistor M3 constitute a plurality of amplification transistors. In other words, the amplifier 10 is an amplifier including the plurality of amplification transistors.

In the case where the amplifier is configured of a plurality of amplification stages, the plurality of amplification transistors (transistors M1 through M3) may be used in any of the amplification stages, that is, used in an input stage, an intermediate stage, or an output stage.

The transistors M1 through M3 are, for example, MOSFETs (Metal Oxide Semiconductor Field Effect Transistors).

A gate end G1 of the transistor M1, a gate end G2 of the transistor M2, and a gate end G3 of the transistor M3 are connected in common with one another. A source end S1 of the transistor M1, a source end S2 of the transistor M2, and a source end S3 of the transistor M3 are connected in common with one another. A drain end D1 of the transistor M1, a drain end D2 of the transistor M2, and a drain end D3 of the transistor M3 are connected in common with one another. Note that the meaning of the expression "connected in common" includes a state in which terminals are electrically connected, that is, connected together in a DC way so as to be given a common DC voltage, for example.

Each of the transistor M1, the transistor M2, and the transistor M3 has a back-gate end. To be more specific, the transistor M1 has a back-gate end (first back-gate end) B1. The transistor M2 has a back-gate end (second back-gate end) B2. The transistor M3 has a back-gate end (third back-gate end) B3. The "back-gate" will be explained later in detail with reference to FIG. 4.

The amplifier 10 further includes a power supply terminal PT1, a power supply terminal PT2, and a power supply terminal PT3. The power supply terminal PT1 is a first power supply terminal configured to apply a voltage to the back-gate end B1. The power supply terminal PT2 is a second power supply terminal configured to apply a voltage to the back-gate end B2. The power supply terminal PT3 is a third power supply terminal configured to apply a voltage to the back-gate end B3.

The power supply terminals PT1 through PT3 can be electrically isolated from one another in a favorable state by, for example, being wired separately in the semiconductor chip. With this, the power supply terminal PT1, the power supply terminal PT2, and the power supply terminal PT3 are so configured as to be set to different voltages, respectively. For example, the power supply terminal PT1 is set to a voltage Vb1, the power supply terminal PT2 is set to a voltage Vb2, and the power supply terminal PT3 is set to a voltage Vb3. Even if the power supply terminals PT1 through PT3 are not electrically isolated from one another in a favorable state, it is sufficient that different voltages can be respectively set thereto.

The source ends S1, S2, and S3 are connected in common and then connected to a ground (GND) through an inductance LS. In other words, the source ends S1 through S3 are connected to the ground in a DC way. The inductance LS provides impedance with which the transistors M1 through M3 are driven properly.

The amplifier 10 further includes a power supply terminal GT1 configured to supply a gate bias voltage to the gate ends G1, G2 and G3 that are connected in common. The power supply terminal GT1 has a voltage of Vb0, for example.

A resistor Rgb is provided between the power supply terminal GT1 and the gate ends G1 through G3. An appropriate gate bias voltage is supplied to the gate ends G1, G2, and G3 by appropriately selecting the resistor Rgb. With the appropriate gate bias voltage, the transistor M1, the transistor M2, and the transistor M3 are driven in a desired bias state.

The amplifier 10 furthermore includes a transistor MC. The transistor MC is an FET (cascode connection FET) that is connected with all of the plurality of amplification transistors (transistor M1, transistor M2, and transistor M3) in a cascode connection manner. Like the transistors M1 through M3, the transistor MC is also configured with a MOSFET, for example.

The transistor MC has a source end SC configured to supply a voltage and a current to the source ends S1 through S3. The source end SC is connected with the source ends S1 through S3.

A voltage is supplied from a power supply terminal GT2 to a gate end GC of the transistor MC. The power supply terminal GT2 has a voltage of VCAS, for example.

A drain end DC of the transistor MC is connected with a power supply VDD through an inductance LD. An appropriate voltage is supplied from the power supply terminal GT2 to the gate end GC. An appropriate voltage and an appropriate current are supplied from the power supply VDD to the transistor MC, and further an appropriate voltage and an appropriate current are supplied to the transistors M1 through M3. Accordingly, the transistor MC and the transistors M1 through M3 function as an amplifier. The inductance LD isolates the drain end DC from the power supply VDD in high frequencies (in RF).

The amplifier 10 further includes an input terminal 11 and an output terminal 12. The input terminal 11 is a terminal for receiving a signal to be amplified by the amplifier 10. A high frequency signal (RF signal) is inputted to the input terminal 11. The output terminal 12 is a terminal for outputting a signal amplified by the amplifier 10. An RF signal is outputted from the output terminal 12. In other words, the amplifier 10 is a high frequency power amplifier that is configured to amplify RF signals.

A capacitor Cin is provided between the input terminal 11 and the gate ends G1 through G3 of the transistors M1 through M3. A capacitor Cout is provided between the output terminal 12 and the drain end DC of the transistor MC. The Cin and the Cout are DC cut capacitors. The Cin and the Cout may be used in a matching circuit.

With the configuration described above, the high frequency power (RF signal) received by the input terminal 11 is inputted in common to the gate ends G1 through G3 of the transistors M1 through M3 in the amplifier 10. Further, the amplifier 10 amplifies the high frequency power and outputs the amplified high frequency power from the drain end DC of the transistor MC. In other words, the amplifier 10 is an amplifier using the plurality of amplification transistors (transistors M1 through M3) and is also a cascode connection-type amplifier using the transistor MC.

In the amplifier 10 according to the first embodiment, the power supply terminals PT1 through PT3 for applying voltages to the back-gate ends B1 through B3 of the transistors M1 through M3 are configured so that different voltages can be set. Because of the power supply terminals PT1 through PT3 having different voltages, different voltages are supplied to the back-gate ends B1 through B3 so as to control the characteristics of the amplifier 10.

For example, in the case where the amplifier 10 is used in a communication device that performs wireless communications, the amplifier 10 is used to amplify a modulation signal (modulation wave). Amplifiers to amplify the modulation signals are required to have high-level linear characteristics in many cases. As indices to indicate such linear characteristics, a third order intermodulation distortion (IMD3) characteristic and a third order input intercept point (IIP3) are well-known, for example.

As a result of research based on simulations, in the amplifier 10 according to the first embodiment, it has been confirmed that the linear characteristic of the amplifier 10 is improved by making the back-gate ends B1 through B3 respectively have appropriate voltages.

In order to improve the linear characteristic of the amplifier 10, it is preferable that the voltages of the back-gate ends B1 through B3 be of three types, that is, a positive voltage relative to the ground, a voltage equal to the ground, and a negative voltage relative to the ground.

Figure 2:
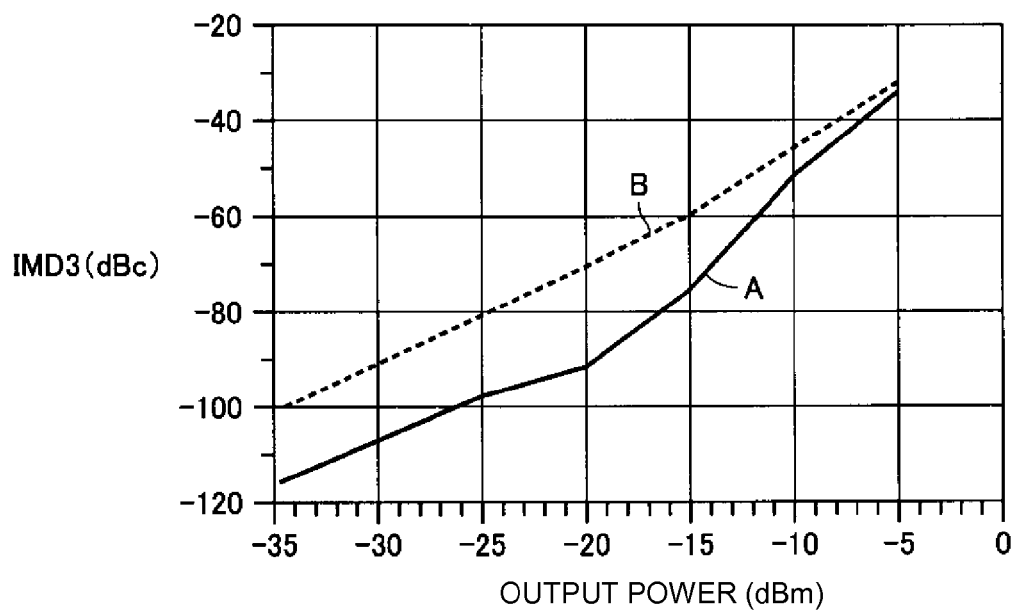
FIG. 2 is a graph illustrating a third order intermodulation distortion (IMD3) characteristic of the amplifier.
Figure 3:
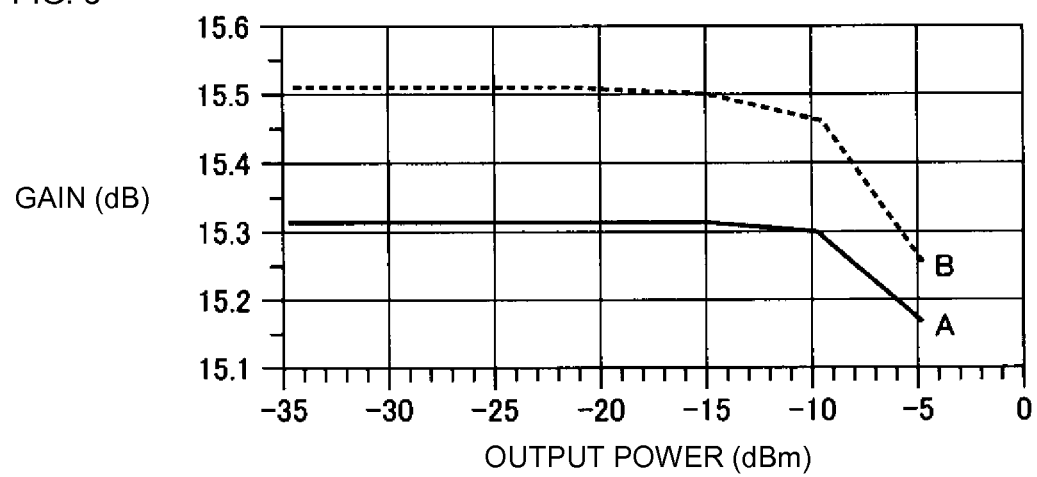
FIG. 3 is a graph illustrating a gain characteristic of the amplifier.

FIGS. 2 and 3 are diagrams for explaining the simulation results in which the linear characteristic of an amplifier having the configuration of the amplifier 10 as shown in FIG. 1 (hereinafter, this amplifier is also simply called "amplifier 10" in some case) is improved.

FIG. 2 is a graph illustrating the third order intermodulation distortion (IMD3) characteristics of the amplifier. The horizontal axis represents the output power (dBm) of the amplifier and the vertical axis represents IMD3 (dBc), respectively.

In FIG. 2, two of the third order intermodulation distortion characteristics are illustrated with a line A and a line B, respectively. The line A indicates the characteristic in the first embodiment, while the line B indicates the characteristic in a comparative example.

The line A indicates the third order intermodulation distortion characteristic of the amplifier 10 in the case where the back-gate ends B1 through B3 were respectively set to different voltages in the amplifier 10 shown in FIG. 1. More specifically, the back-gate end B1 was set to a voltage equal to the ground, the back-gate end B2 was set to a positive voltage relative to the ground, and the back-gate end B3 was set to a negative voltage relative to the ground.

The line B indicates the third order intermodulation distortion characteristic of the amplifier 10 in the case where the back-gate ends B1 through B3 were all set to the voltage equal to the ground in the amplifier 10 shown in FIG. 1.

Other conditions needed for the simulations such as the gate bias voltages applied to the respective transistors, the frequency of the power (signal) to be amplified, and the like were so set as to be the same between the line A and the line B. The frequency was selected from a range of several hundreds of MHz to a few GHz.

As can be understood from FIG. 2, the first embodiment (line A) exhibits more improvement in IMD3 than the comparative example (line B). Although the amount of the improvement varies in accordance with the output power of the amplifier, it was confirmed that the IMD3 was improved by no less than approximately 10 dB in a relatively wide range of the output power.

The reason why the linear characteristic of the amplifier is improved is as follows. That is, there exists mutual conductance gm which is one of the parameters indicating the characteristics of an FET such as the transistor M1 illustrated in FIG. 1. The third order intermodulation disorder (IMD3) characteristic is affected by the amount of change in the mutual conductance gm with respect to the input to the transistor M1, that is, a level of a voltage (Vgs) between the gate end G1 and the source end S1 in this case. To be more specific, if the magnitude of gm", which is obtained by performing a second-order differentiation on the mutual conductance gm with Vgs, with respect to Vgs (hereinafter, referred to as a "gm"-Vgs characteristic") is constant, the third order intermodulation distortion characteristic becomes better. In contrast, if the gm"-Vgs characteristic is not constant, the third order intermodulation distortion characteristic becomes worse.

In the transistor M1, a range of Vgs in which the gm"-Vgs characteristic is substantially constant and a range of Vgs in which the gm"-Vgs characteristic is not constant (change is large) are present. For example, when a voltage is applied to the back-gate end B1 of the transistor M1, the range of Vgs in which the gm"-Vgs characteristic is constant (or is nearly constant) is shifted. The mode of this shift can be controlled by the voltage applied to the back-gate end B1. The same applies to the transistors M2 and M3.

According to the first embodiment, different voltages are applied to the back-gate ends B1 through B3 of the transistors M1 through M3, respectively. This makes the respective gm"-Vgs characteristics of the transistors M1 through M3 be shifted. In the case where voltages are appropriately applied to the back-gate ends B1 through B3, the gm"-Vgs characteristics of the transistors M1 through M3 cancel out one another so that the range of Vgs in which the gm"-Vgs characteristic is constant can be expanded. As a result, the plurality of the amplification transistors constituted by the transistors M1 through M3 can obtain a favorable gm"-Vgs characteristic as a whole, in other words, can obtain a favorable third order intermodulation distortion characteristic where the gm" has a flat characteristic with respect to the Vgs.

FIG. 3 is a graph illustrating the gain characteristics of the amplifier. The horizontal axis represents the output power of the amplifier (dBm) and the vertical axis represents the gain (dB), respectively.

As shown in FIG. 3, although the gain in the first embodiment (line A) is slightly lower than that of the comparative example (line B), the amount of the decrease relative to the comparative example is only approximately 0.2 dB, which is a level of the decrease that will not be taken as a problem.

As such, according to the simulation results shown in FIGS. 2 and 3, the linear characteristic, that is, the IMD3 of the amplifier is improved in the first embodiment. Other basic characteristics of the amplifier (for example, the gain characteristic) are hardly degraded.

Referring to FIG. 1 again, in the amplifier 10 according to the first embodiment, the gate ends of the transistors M1 through M3 constituting the plurality of amplification transistors are connected in common. With this, for example, DC cut capacitors or the like to isolate the gate ends from one another in a DC way are unnecessary. In addition, applying the voltages to the back-gate ends B1 through B3 makes it possible to control the characteristics of the amplifier 10. This control operation is independent of the size (cell size) or the like of each of the transistors M1 through M3. Accordingly, the size (cell size or the like) of each of the transistors M1 through M3 can be optimized so that the current consumption is reduced.

As such, with the amplifier 10 according to the first embodiment, it is possible to provide an amplifier in which the reduction in size and power consumption is realized and a linear characteristic, for example, a third order intermodulation distortion characteristic is improved.

An amplifier like the amplifier 10 can be used in a variety of applications. As an example of the application, the stated amplifier is used to amplify the signals received from a satellite of GPS (Global Positioning System). Further, amplifiers according to other embodiments, which will be explained later in detail, are also used to amplify the signals of a wireless LAN (WLAN: Wireless Local Area Network), the signals of FDMA (Frequency Division Multiple Access), and so on.

Here, the back-gate ends (B1 through B3) included in the transistors M1 through M3 as shown in FIG. 1 will be briefly described. Each of the back-gate ends is, in summary, an end portion of each back-gate forming an FET body.

Figure 4:
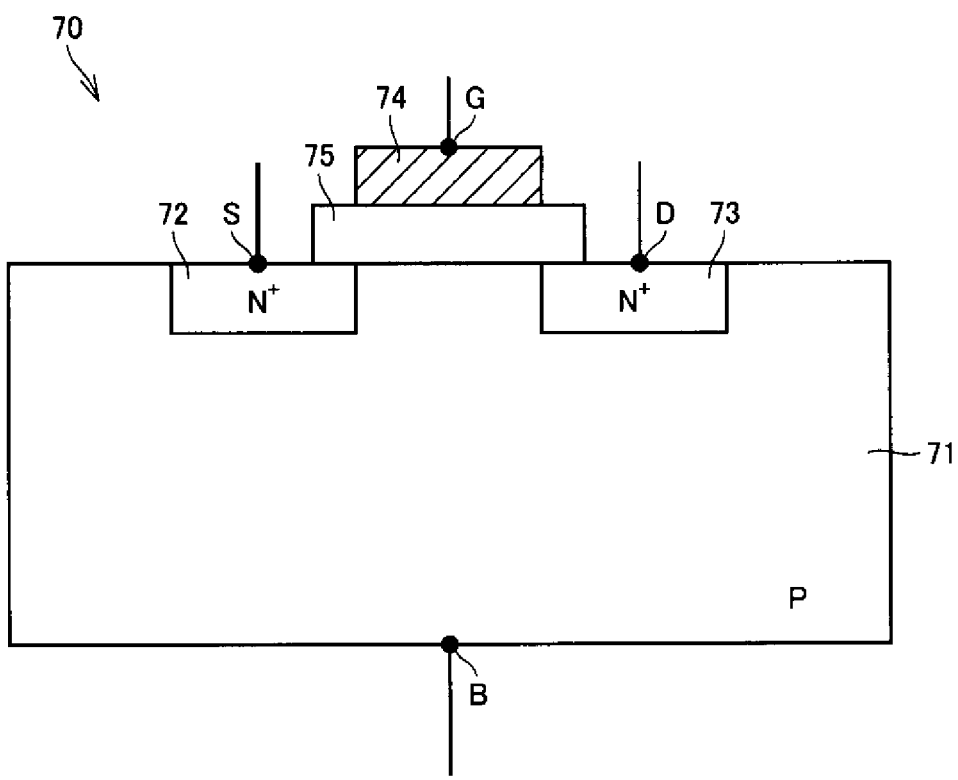
FIG. 4 is a schematic diagram illustrating a cross-section structure of the FET.

FIG. 4 is a schematic diagram illustrating a cross-section structure of an FET according to the first embodiment.

As shown in FIG. 4, an FET 70 includes a body 71, a source 72, a drain 73, a gate 74, and an insulation film 75.

Being cited as an example, the body 71 is formed with a P-type semiconductor substrate. The source 72 and the drain 73 are formed with $N^+$-type semiconductors. The gate 74 is a metal electrode. The insulation film 75 is an oxide film, for example, and insulates the gate 74 from the body 71, the source 72, and the drain 73.

The body 71, the source 72, the drain 73, and the gate 74 can be electrically accessed. Specifically, the body 71 has a back-gate end B through which a voltage can be supplied to the body 71. A voltage is supplied to the back-gate end B in order to apply the voltage to the body 71. Likewise, the source 72 has a source end S, the drain 73 has a drain end D, and the gate 74 has a gate end G, respectively.

It can be considered that the back-gate end B, the gate end G, the source end S, and the drain end D shown in FIG. 4 correspond, for example, to the back-gate end B1, the gate end G1, the source end S1, and the drain end D1 shown in FIG. 1, respectively.

Based on the structure of the FET 70 as described above, a voltage applied to the back-gate end B will be described. For the sake of convenience in explanation, the source end S is assumed to be grounded. That is, the source end S has the same voltage (potential) as the ground.

As shown in FIG. 4, a PN-junction is formed between the body 71 and the source 72. Accordingly, a voltage can be applied to the back-gate end B within a range in which an undesirable current (leak current) does not flow from the body 71 toward the source 72. For example, in the case where the FET 70 uses a silicon material, the voltage of the back-gate end B can be set within a range in which the voltage does not exceed approximately 0.7 volts, which is a forward bias threshold voltage of the PN-junction (of a diode). Furthermore, the voltage of the back-gate end B can be set within a range in which the voltage does not drop below a reverse bias breakdown voltage of the PN-junction (of the diode).

In other words, it is preferable for the voltage applied to the back-gate end B (which corresponds to Vb1 through Vb3 in FIG. 1) to be higher than the breakdown voltage (negative value) and lower than approximately 0.7 volts.

FIG. 4 illustrates, as an example, a case in which the body 71 is formed with a P-type semiconductor substrate. However, the body 71 may not be formed with a P-type semiconductor substrate, but with an N-type semiconductor substrate. In the case where the body 71 is formed with an N-type semiconductor substrate, the source 72 and the drain 73 are formed with $P^+$-type semiconductors. With this, a PN-junction is formed between the source 72 and the body 71. As such, the voltage of the back-gate end can be set while considering a forward bias threshold voltage of the PN-junction (of a diode) and a reverse bias breakdown voltage thereof.

As described earlier, different voltages are supplied to the back-gate ends B1 through B3, respectively, in the amplifier 10 shown in FIG. 1. This will be described next with reference to FIG. 5.

Figure 5:
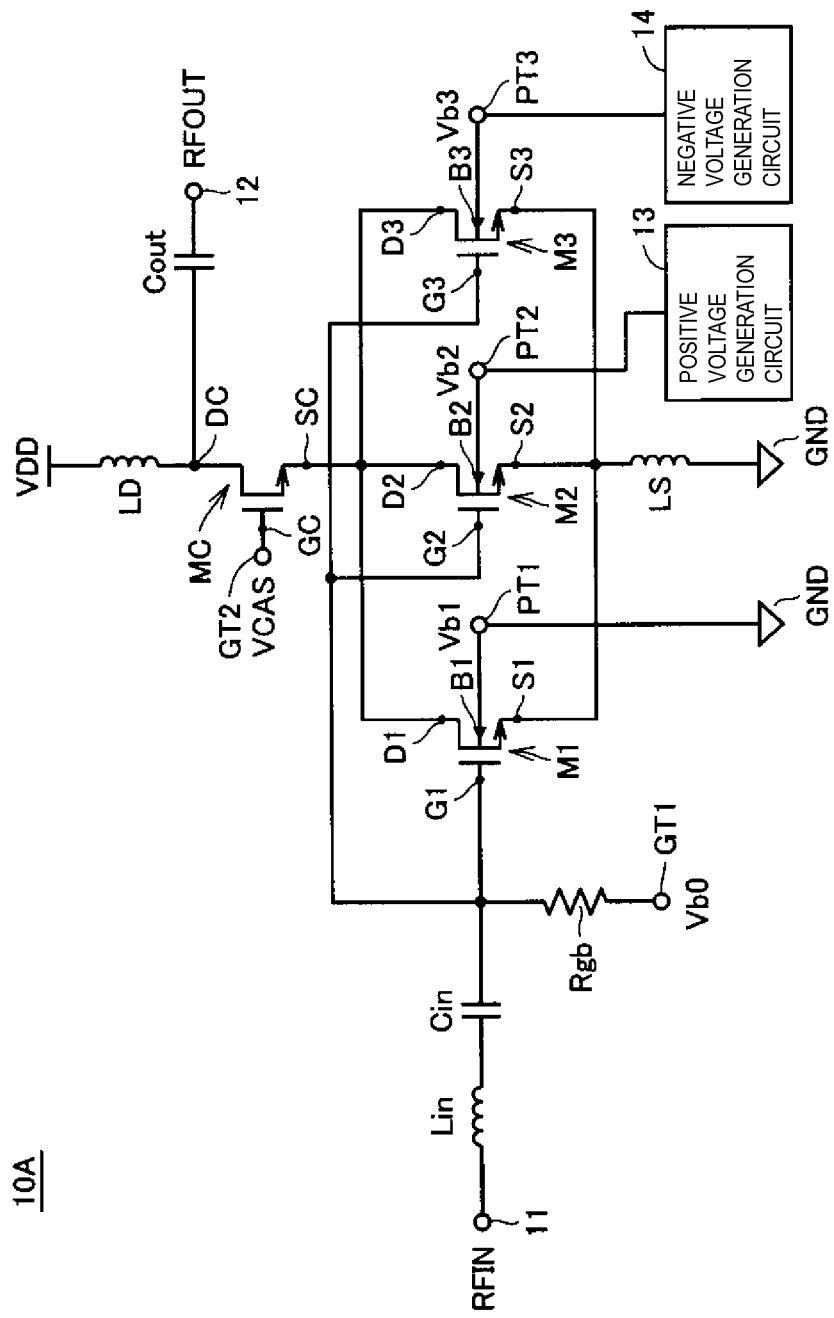
FIG. 5 is a diagram for explaining a configuration in which the different voltages are supplied to the back-gate ends.

FIG. 5 is a diagram for explaining a configuration in which different voltages are supplied to the back-gate ends B1 through B3 of the transistors M1 through M3.

An amplifier 10A shown in FIG. 5 further includes a positive voltage generation circuit 13 and a negative voltage generation circuit 14 in comparison with the configuration of the amplifier 10 shown in FIG. 1. Note that the amplifier 10A furthermore includes an inductance Lin.

The positive voltage generation circuit 13 is so configured as to be able to generate a positive voltage relative to the ground (GND). The negative voltage generation circuit 14 is so configured as to be able to generate a negative voltage relative to the ground. Various kinds of circuits to which known techniques are applied can be used in the positive voltage generation circuit 13, the negative voltage generation circuit 14, and the like. An example of the configuration of the negative voltage generation circuit 14 will be explained later referring to FIG. 9.

The inductance Lin constitutes an input matching circuit of the amplifier 10A along with capacitance Cin as needed.

In FIG. 5, the power supply terminal PT1 is grounded. With this, the power supply terminal PT1 has the same voltage as the ground. The power supply terminal PT2 is connected with the positive voltage generation circuit 13. This makes the power supply terminal PT2 have a positive voltage relative to the ground. The power supply terminal PT3 is connected with the negative voltage generation circuit 14. This makes the power supply terminal PT3 have a negative voltage relative to the ground.

The amplifier 10A shown in FIG. 5 has the positive voltage generation circuit 13, the negative voltage generation circuit 14, and the like at the inside thereof. This makes it unnecessary to provide a negative voltage power source at the outside of the amplifier 10A when the amplifier 10A is used.

Although not illustrated in FIG. 5, a resistor may be inserted between the positive voltage generation circuit 13 and the power supply terminal PT2. This stabilizes a voltage supplied to the back-gate end B2. Meanwhile, an inductance may be inserted between the positive voltage generation circuit 13 and the power supply terminal PT2. With this, a voltage supplied to the back-gate end B2 is made stable while being isolated in high frequencies between the back-gate end B2 and the power supply terminal PT2. Likewise, a resistor and/or an inductance may also be inserted between the negative voltage generation circuit 14 and the power supply terminal PT3.

Second Embodiment

As described earlier, the amplifier 10 shown in FIG. 1 and the amplifier 10A shown in FIG. 5 are used in communication devices. In such cases, the amplifiers are used in combination with switches, for example.

Figure 6:
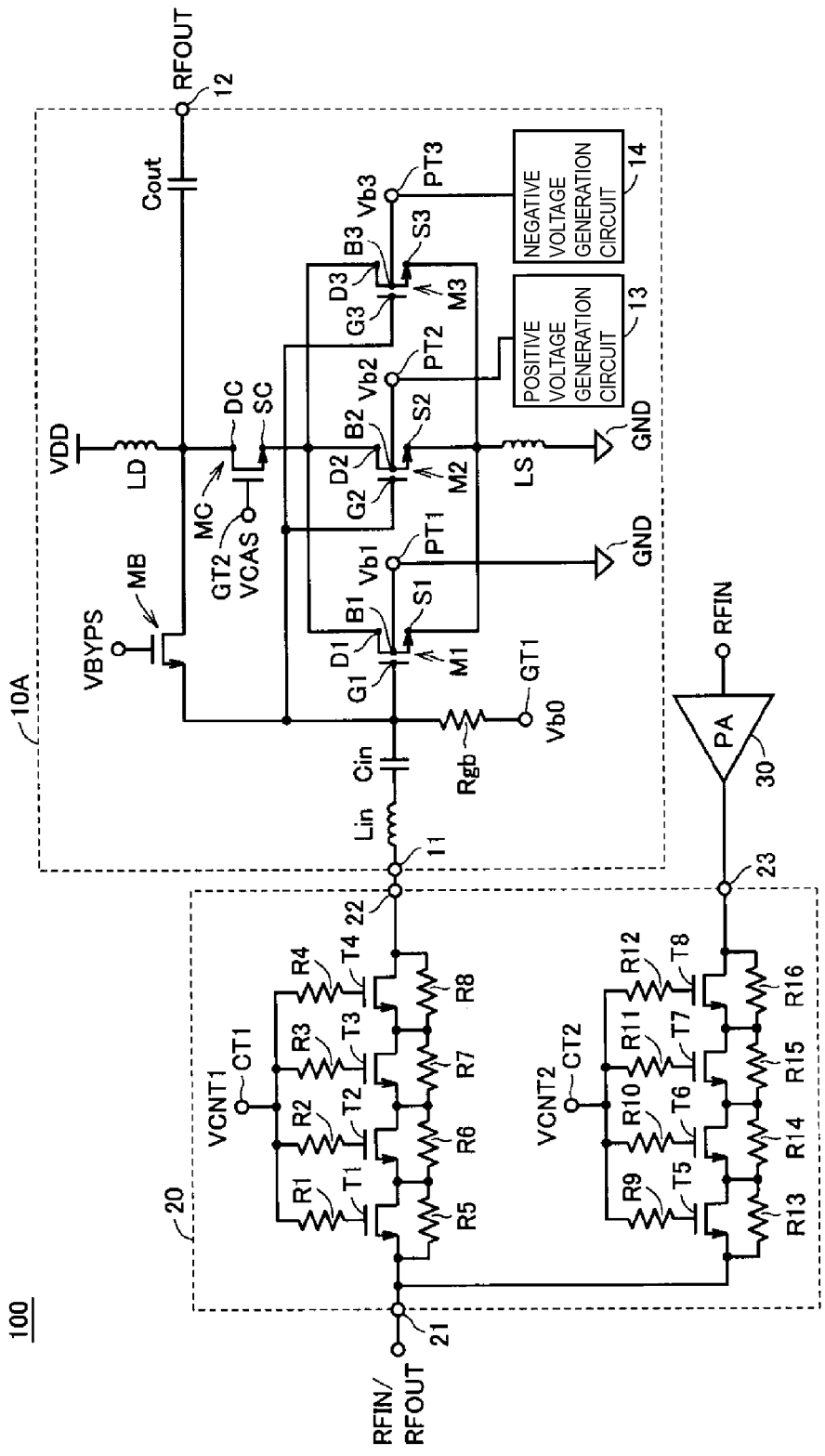
FIG. 6 is a diagram for explaining a combination of an amplifier and a switch.

FIG. 6 is a diagram for explaining a combination of an amplifier and a switch.

Referring to FIG. 6, a communication device 100 includes the amplifier 10A, a switch 20, and a power amplifier (PA) 30.

In FIG. 6, the switch 20 serving as a single pole double throw (SPDT) switch is illustrated, as an example. The switch 20 includes a terminal 21, a terminal 22, and a terminal 23.

The terminal 21 is connected to, for example, an antenna (not illustrated). The antenna transmits and receives high frequency (RF) electromagnetic waves. Accordingly, high frequency power (transmission wave) is outputted from the terminal 21, and high frequency power (receiving wave) is inputted to the terminal 21. Each of the transmission wave and the receiving wave is a modulation wave. The terminal 22 is connected with the terminal 11 of the amplifier 10A. The terminal 23 is connected with the output of the power amplifier 30.

Referring to FIG. 6, the switch 20 includes transistors T1 through T8, resistors R1 through R16, and control terminals CT1 and CT2.

The transistors T1 through T4 switch a state of the connection between the terminal 21 and the terminal 22. By disposing a plurality of the transistors T1 through T4 between the terminal 21 and the terminal 22, a high frequency signal applied to the respective transistors is voltage-divided, thereby raising the withstand voltage level of the switch 20.

Each of the resistors R1 through R4 connects each of the gate ends of the transistors T1 through T4 with the control terminal CT1. With this, a voltage applied to the control terminal CT1 (for example, VCNT1) is applied to the gates of the transistors T1 through T4 via the resistors R1 through R4. Applying the voltage to the gates of the transistors T1 through T4 causes the transistors T1 through T4 to be in an ON state, whereby the terminal 21 and the terminal 22 are conductive therebetween.

Each of the resistors R5 through R8 connects the drain end with the source end of each of the transistors T1 through T4. In other words, each of the resistors R5 through R8 constructs a route that bypasses the drain end and the source end of each of the transistors T1 through T4. With this, for example, in the case where the transistors T1 through T4 are in an OFF state, a high frequency signal is voltage-divided via the resistors R5 through R8 with certainty, thereby raising the withstand voltage level of the switch 20.

The transistors T5 through T8 switch a state of connection between the terminal 21 and the terminal 23. By disposing a plurality of the transistors T5 through T8 between the terminal 21 and the terminal 23, a high frequency signal applied to the respective transistors is voltage-divided, thereby raising the withstand voltage level of the switch 20.

Each of the resistors R9 through R12 connects each of the gate ends of the transistors T5 through T8 with the control terminal CT2. With this, a voltage applied to the control terminal CT2 (for example, VCNT2) is applied to the gates of the transistors T5 through T8 via the resistors R9 through R12, respectively. Applying the voltage to the gates of the transistors T5 through T8 causes the transistors T5 through T8 to be in an ON state, whereby the terminal 21 and the terminal 23 are conductive therebetween.

Each of the resistors R13 through R16 constructs a route that bypasses the drain end and the source end of each of the transistors T5 through T8. With this, for example, in the case where the transistors T5 through T8 are in an OFF state, a high frequency signal is voltage-divided via the resistors R13 through R16 with certainty, thereby raising the withstand voltage level of the switch 20.

With the configuration discussed above, the switch 20 can output, from the terminal 22, a receiving wave which is received from the terminal 21, for example. Further, the switch 20 can output, to the terminal 21, a transmission wave which is received from the terminal 23. The switch 20 is used to switch the operation mode of the communication device 100 between a transmitting operation and a receiving operation in a time shearing manner, for example.

The input terminal 11 of the amplifier 10A is connected with the terminal 22 of the switch 20. With this, a receiving signal received by the antenna is outputted to the input terminal 11 of the amplifier 10A through the terminals 21 and 22 of the switch 20. The amplifier 10A amplifies the stated receiving signal and outputs the amplified signal to the output terminal 12. In general, communication devices use a low noise amplifier (LNA) as an amplifier to amplify the received high frequency power. In other words, the amplifier 10A is used as a low noise amplifier in the communication device 100.

The output of the power amplifier 30 is connected with the terminal 23 of the switch 23. With this, a transmission signal amplified by the power amplifier 30 is outputted through the terminal 23 and the terminal 21 of the switch 20. The power amplifier 30 may have the same configuration as that of the amplifier 10A. In other words, the amplifier 10A may be used as the power amplifier in the communication device 100.

The communication device 100 shown in FIG. 6 switches its operation mode between the transmitting operation and the receiving operation by the switch 20. Such communication device is preferably used in a communication system using, for example, a time division duplex (TDD) technique. As a communication system using the TDD technique, a wireless LAN can be cited, for example. That is, the amplifier 10A is preferably used in communication devices for wireless LANs.

Third Embodiment

FIG. 6 illustrates the communication device 100 which is a type of communication device in which a transmitting operation and a receiving operation are switched therebetween by the switch 20 in a time shearing manner, for example. Meanwhile, among communication devices, there exists a type of communication device in which a transmitting operation and a receiving operation are carried out at the same time. In this case, for example, a duplexer (DUP) is used instead of the switch in the communication device.

Figure 7:
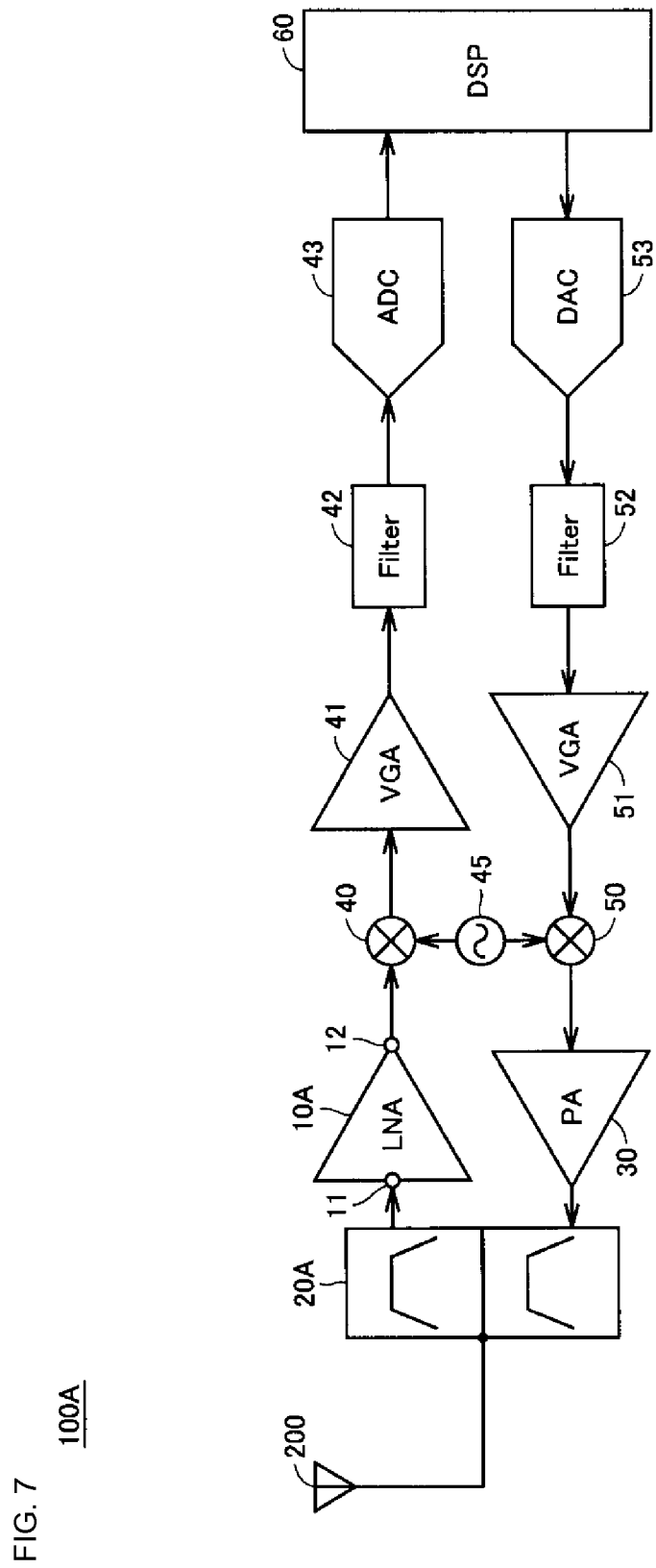
FIG. 7 is a diagram for explaining a communication device using a duplexer.

FIG. 7 is a diagram for explaining a communication device 100A using a duplexer.

Referring to FIG. 7, the communication device 100A includes a duplexer 20A, the amplifier 10A, the power amplifier 30, and an antenna 200.

The duplexer 20A isolates a transmission frequency band signal (transmission signal) and a receiving frequency band signal (receiving signal) from each other. More specifically, the duplexer 20A allows a receiving signal to pass between the antenna 200 and the amplifier 10A. In addition, the duplexer 20A allows a transmission signal to pass between the power amplifier 30 and the antenna 200.

The communication device 100A includes a mixer 40, a voltage controlled variable gain amplifier (VGA) 41, a filter 42, an analog-to-digital converter (ADC) 43, and a digital signal processor (DSP) 60.

The receiving signal is amplified by the amplifier 10A. The amplified receiving signal undergoes the frequency conversion (for example, down-converted) by the mixer 40. The down-converted receiving signal is adjusted to an appropriate signal level by the VGA 41. Unnecessary components in the receiving signal adjusted to the appropriate signal level are removed by the filter 42. The receiving signal having the unnecessary components removed is converted to a digital signal by the ADC 43. The receiving signal converted to the digital signal is processed by the DSP 60.

The communication device 100A further includes a mixer 50, a VGA 51, a filter 52, and a DAC 53.

The transmission signal in a digital form generated by the DSP 60 is converted to an analog signal by the digital-to-analog converter (DAC) 53. Unnecessary components in the transmission signal converted to the analog signal are removed by the filter 52. The transmission signal having the unnecessary components removed is adjusted to an appropriate signal level. The transmission signal adjusted to the appropriate signal level undergoes the frequency conversion (for example, up-converted) by the mixer 50. The up-converted transmission signal is inputted to the power amplifier 30.

The communication device 100A furthermore includes a transmitter 45. The transmitter 45 provides a predetermined frequency signal to the mixer 40 and the mixer 50.

In the communication device 100A shown in FIG. 7, the transmission signal and the receiving signal are isolated from each other by the duplexer 20A. Such communication device is preferably used in a communication system using, for example, a frequency division multiple access (FDMA) technique. As a communication system using the FDMA technique, a mobile communication terminal making use of a code division multiple access (CDMA) technique can be cited, for example. That is, the amplifier 10A is preferably used in mobile communication terminals making use of the CDMA technique.

Variation

Referring to FIG. 1 again, the plurality of amplification transistors are constituted by the three transistors M1 through M3 in the amplifier 10 as shown in FIG. 1. However, the number of transistors constituting the plurality of amplification transistors is not intended to be limited to three. In other words, the number of transistors for constituting the plurality of amplification transistors can take various values.

Figure 8:
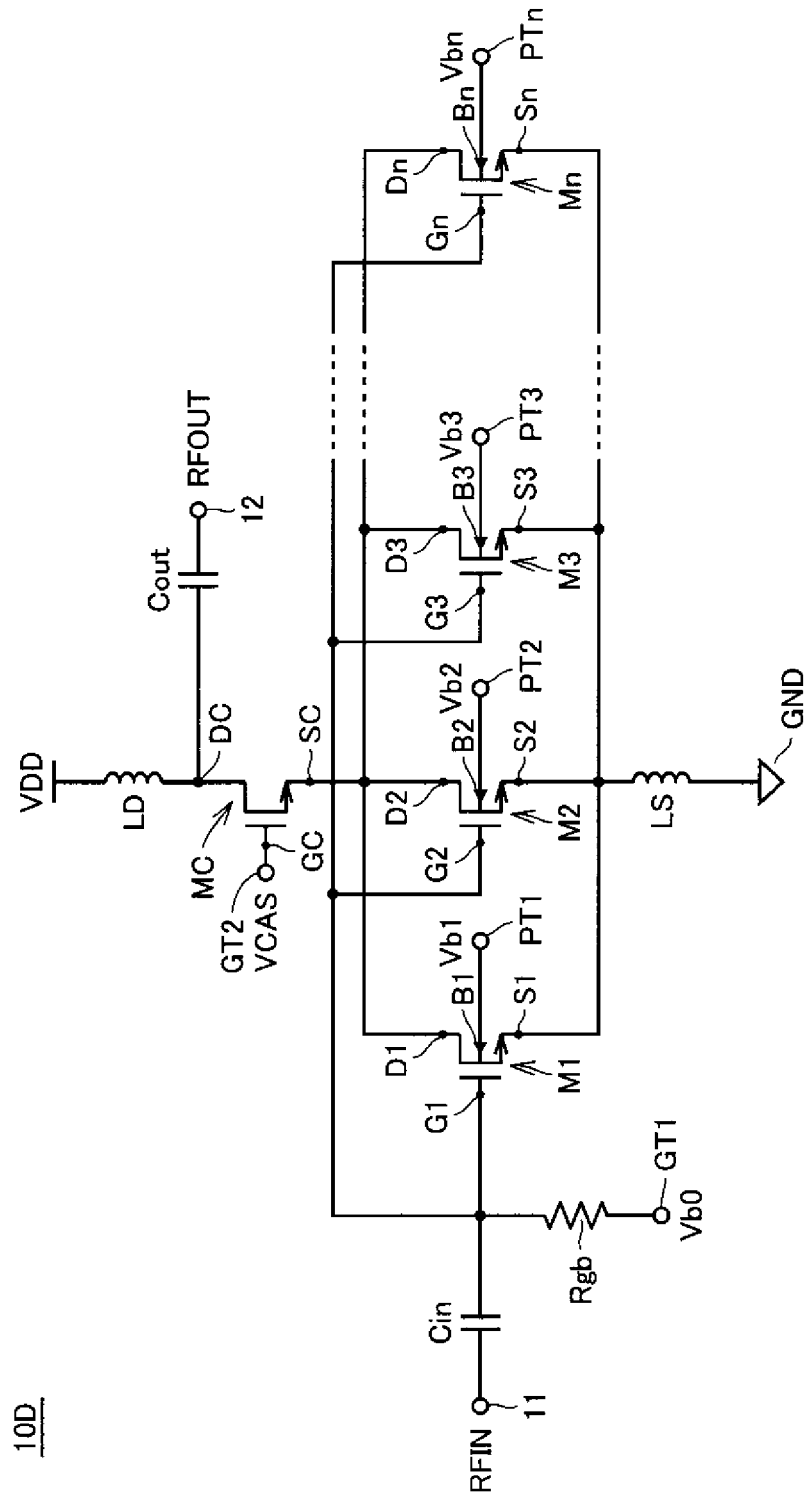
FIG. 8 is a diagram for explaining an amplifier according to a variation.

FIG. 8 is a diagram for explaining an amplifier 10D according to a variation.

As shown in FIG. 8, the amplifier 10D includes no less than four transistors serving as the transistors for constituting the plurality of amplification transistors. More specifically, "n" pieces of the transistors, including the transistor M1 through a transistor Mn, constitute the plurality of amplification transistors.

A gate end Gn of the transistor Mn is connected in common with the gate ends (G1 through G3, and so on) of the other transistors (M1 through M3, and so on). A source end Sn of the transistor Mn is connected in common with the source ends (S1 through S3, and so on) of the other transistors (M1 through M3, and so on). A drain end Dn of the transistor Mn is connected in common with the drain ends (D1 through D3, and so on) of the other transistors (M1 through M3, and so on).

The transistor Mn includes a back-gate end Bn. The amplifier 10D includes a power supply terminal PTn configured to apply a voltage to the back-gate end Bn. The power supply terminals PT1 through PTn are configured so that different voltages can be set. For example, the power supply terminal PTn has a voltage of Vbn.

In the amplifier 10D, by appropriately setting the voltages of the power supply terminals PT1 through PTn, of characteristics of the amplifier 10D, for example, the linear characteristic is improved.

The number of transistors constituting the plurality of amplification transistors in the amplifier 10D shown in FIG. 8 is greater than that in the amplifier 10 shown in FIG. 1. This makes it possible for the amplifier 10D to have a large number of combinations corresponding to the voltages applied to the back-gate ends B1 through Bn of the transistors M1 through Mn. As a result, the characteristics of the amplifier 10D can be controlled in a fine manner.

Configuration of Negative Voltage Generation Circuit

Figure 9:
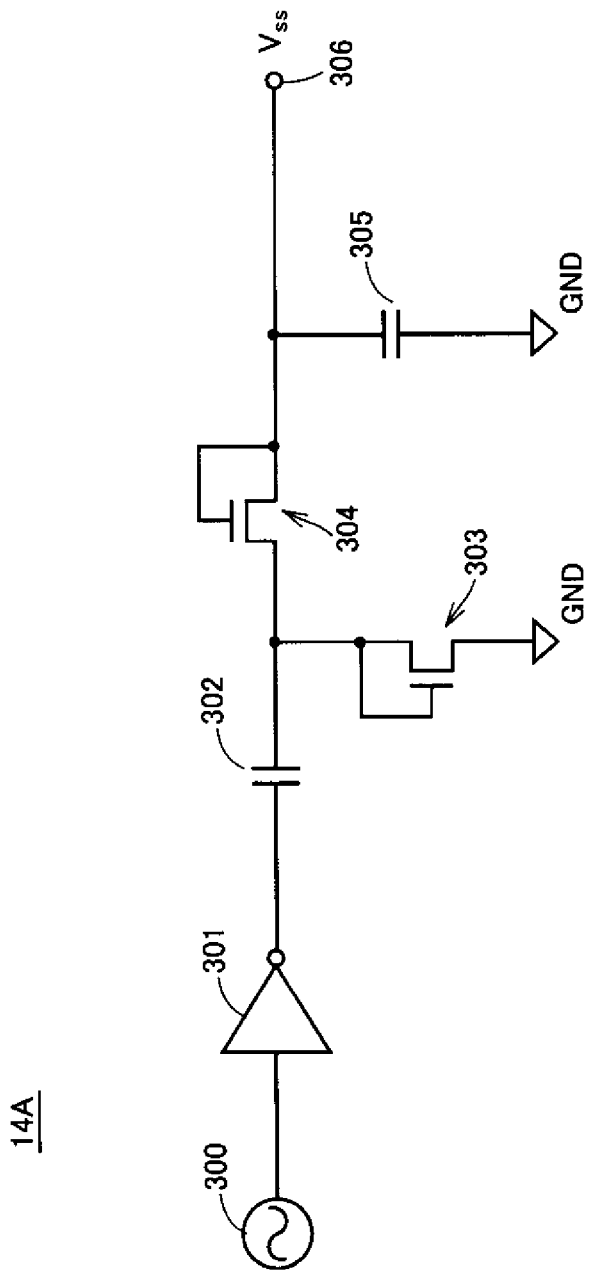
FIG. 9 is a diagram for explaining an example of a configuration of a negative voltage generation circuit.

FIG. 9 is a diagram for explaining an example of the configuration of a negative voltage generation circuit such as the negative voltage generation circuit 14 shown in FIG. 5 and the like.

Referring to FIG. 9, a negative voltage generation circuit 14A includes an alternating-current power source 300, a NOT gate (inverter) 301, capacitors 302 and 305, transistors 303 and 304, and an output terminal 306.

The alternating-current power source 300 generates alternating-current power (for example, a sine wave) based on the ground (GND). The alternating-current power generated by the alternating-current power source 300 is inputted to the inverter 301. The inverter 301 generates rectangular-wave power having a positive voltage and a negative voltage based on the ground in synchronization with periods of the inputted alternating-current power. The rectangular-wave power generated by the inverter 301 is outputted toward the capacitor 302.

The capacitors 302 and 305 are charged and discharged upon receiving the power from the inverter 301.

The transistors 303 and 304 are FETs. A gate end and a drain end of the transistor 303 are electrically short-circuited, and a gate end and a drain end of the transistor 304 are also electrically short-circuited. In other words, the transistors 303 and 304 each function as a diode taking a direction extending from the drain end toward the gate end as a forward direction thereof.

During the voltage of the rectangular-wave power from the inverter 301 being positive, the capacitor 302 is charged by the voltage applied between the inverter 301 and the source end of the transistor 303 (that is, the ground) so that the inverter 301 side of the capacitor 302 is positive in polarity.

Meanwhile, during the voltage of the rectangular-wave power from the inverter 301 being negative, the capacitor 302 is discharged toward the inverter 301. At this time, the capacitor 305 is charged via the transistor 304 so that the transistor 304 side of the capacitor 305 is negative in polarity. Accordingly, a negative voltage Vss is generated at the output terminal 306.

The embodiments disclosed herein are to be understood in all ways as exemplary and in no way limiting. The scope of the present invention is defined by the appended claims rather than by the foregoing descriptions, and the meanings equivalent to the appended claims as well as all the modifications made within the scope of the appended claims are intended to be encompassed thereby.

While preferred embodiments of the invention have been described above, it is to be understood that any variations and modifications will be apparent to those skilled in the art without departing from the scope and spirit of the invention. The scope of the invention, therefore, is to be determined solely by the following claims.

What is claimed is:

1. An amplifier comprising:
a first FET including a first back-gate end;
a second FET including a second back-gate end;
a third FET including a third back-gate end;
a first power supply terminal configured to apply a first voltage to the first back-gate end;
a second power supply terminal configured to apply a second voltage to the second back-gate end; and
a third power supply terminal configured to apply a third voltage to the third back-gate end,
wherein gate ends of the first through third FETs are connected in common with one another,
source ends of the first through third FETs are connected in common with one another,
drain ends of the first through third FETs are connected in common with one another,
the first through third power supply terminals are configured such that different voltages are set to the first through third power supply terminals,
wherein the source ends of the first through third FETs are grounded in a direct current way, and at least one power supply terminal among the first through third power supply terminals has a negative voltage relative to the ground.

2. The amplifier according to claim 1,
wherein the first power supply terminal has a positive voltage relative to the ground, the second power supply terminal has the same voltage as the ground, and the third power supply terminal has the negative voltage.

3. An amplifier comprising:
a first FET including a first back-gate end;
a second FET including a second back-gate end;
a third FET including a third back-gate end;
a first power supply terminal configured to apply a voltage to the first back-gate end;
a second power supply terminal configured to apply a voltage to the second back-gate end;
a third power supply terminal configured to apply a voltage to the third back-gate end; and
a negative voltage generation circuit configured to supply the negative voltage to the at least one power supply terminal among the first through third power supply terminals, wherein:
gate ends of the first through third FETs are connected in common with one another,
source ends of the first through third FETs are connected in common with one another,
drain ends of the first through third FETs are connected in common with one another,
the first through third power supply terminals are configured such that different voltages are set to the first through third power supply terminals,
the source ends of the first through third FETs are grounded in a direct current way, and
at least one power supply terminal among the first through third power supply terminals has a negative voltage relative to the ground.

4. An amplifier comprising:
a first FET including a first back-gate end;
a second FET including a second back-gate end;
a third FET including a third back-gate end;
a first power supply terminal configured to apply a voltage to the first back-gate end;
a second power supply terminal configured to apply a voltage to the second back-gate end;
a third power supply terminal configured to apply a voltage to the third back-gate end; and
a cascode connection FET connected with all of the first through third FETs in a cascode connection manner, wherein:
gate ends of the first through third FETs are connected in common with one another,
source ends of the first through third FETs are connected in common with one another,
drain ends of the first through third FETs are connected in common with one another,
the first through third power supply terminals are configured such that different voltages are set to the first through third power supply terminals,
the cascode connection FET includes a source end for supplying a voltage and a current to the drain ends of the first through third FETs,
high frequency power is inputted in common to the gate ends of the first through third FETs, and
the amplifier amplifies the high frequency power and outputs the amplified high frequency power from a drain end of a fourth FET.

5. An amplifier comprising:
a first FET including a first back-gate end;
a second FET including a second back-gate end;
a third FET including a third back-gate end;
a first power supply terminal configured to apply a voltage to the first back-gate end;
a second power supply terminal configured to apply a voltage to the second back-gate end;
a third power supply terminal configured to apply a voltage to the third back-gate end; and
a cascode connection FET connected with all of the first through third FETs in a cascode connection manner, wherein:
the cascode connection FET includes a source end for supplying a voltage and a current to the drain ends of the first through third FETs,
high frequency power is inputted in common to the gate ends of the first through third FETs,
the amplifier amplifies the high frequency power and outputs the amplified high frequency power from a drain end of a fourth FET,
the source ends of the first through third FETs are grounded in a direct current way,
at least one power supply terminal among the first through third power supply terminals has a negative voltage relative to the ground, and
the first power supply terminal has a positive voltage relative to the ground, the second power supply terminal has the same voltage as the ground, and the third power supply terminal has the negative voltage.

6. The amplifier according to claim 3, further comprising:
a cascode connection FET connected with all of the first through third FETs in a cascode connection manner,
wherein the cascode connection FET includes a source end for supplying a voltage and a current to the drain ends of the first through third FETs,
high frequency power is inputted in common to the gate ends of the first through third FETs, and
the amplifier amplifies the high frequency power and outputs the amplified high frequency power from a drain end of a fourth FET.

7. The amplifier according to claim 1, wherein the source ends of the first through third FETs are grounded through an inductance.

* * * * *